United States Patent [19]
Raghunath

[11] Patent Number: 5,907,497
[45] Date of Patent: May 25, 1999

[54] UPDATE BLOCK FOR AN ADAPTIVE EQUALIZER FILTER CONFIGURATION

[75] Inventor: Kalavai Janardhan Raghunath, Chatham, N.J.

[73] Assignee: Lucent Technologies Inc., Murray Hill, N.J.

[21] Appl. No.: 08/581,637

[22] Filed: Dec. 28, 1995

[51] Int. Cl.[6] .................................................. G06F 17/10
[52] U.S. Cl. ...................................... 364/724.2; 375/232
[58] Field of Search ........................... 364/724.17–724.2; 375/232, 233

[56] References Cited

U.S. PATENT DOCUMENTS

| | | | |
|---|---|---|---|
| 4,435,823 | 3/1984 | Davis et al. | 364/724.2 |
| 5,243,624 | 9/1993 | Paik et al. | 364/724.19 |
| 5,245,561 | 9/1993 | Sugiyama | 364/724.19 |
| 5,311,546 | 5/1994 | Paik et al. | 364/724.2 |
| 5,363,441 | 11/1994 | Feiner et al. | 379/411 |
| 5,388,062 | 2/1995 | Knutson | 364/724.2 |
| 5,416,799 | 5/1995 | Currivan et al. | 375/232 |
| 5,502,507 | 3/1996 | Kim | 348/607 |
| 5,524,023 | 6/1996 | Tsujimoto | 375/232 |
| 5,646,957 | 7/1997 | Im et al. | 375/233 |

FOREIGN PATENT DOCUMENTS

| | | | |
|---|---|---|---|
| 0-373-468A | 6/1990 | European Pat. Off. | H03H 17/02 |
| 0-583-927A | 2/1994 | European Pat. Off. | H03H 21/00 |

OTHER PUBLICATIONS

N. Weste et al. "Principles of CMOS VLSI Design" 1994, Addison–Wesley XP002065768.

European Search Report, Dated Jun. 9, 1998.

Long, Guozhu, Fuyun Ling and John G. Proakis, "The LMS Algorithm with Delayed Coefficient Adaptation," *IEEE Transactions on Acoustics, Speech, and Signal Processing*, vol. 37, No. 9, Sep. 1989, pp. 1397–1405.

Weste, Neil H.E. and Kamran Eshraghian, *Principles of CMOS VLSI Design: A Systems Perspective*, Chapter 9 CMOS System Design Examples, 9.3 "A TV Echo Canceller," pp. 672–694, AT&T, U.S.A. 1993.

Lee, Edward A. Lee and David G. Messerschmitt, *Digital Communication*, 9.2 "Adaptive Linear Equalizer," pp. 385–394, Kluwer Academic Publishers, Boston, 1988.

Simon Haykin, *Adaptive Filter Theory*, Second Edition, "Stochastic Gradient–Based Algorithms," Chapter 9, pp. 299–307, Prentice Hall, Englewood Cliffs, NJ.

*Primary Examiner*—Emmanuel L. Moise
*Attorney, Agent, or Firm*—Anthony Grillo

[57] ABSTRACT

An update block for an adaptive RAM-based equalizer filter configuration includes a multiplier, an adder, and a plurality of delay units. The multiplier, adder, and delay units are coupled in an manner so as to have the capability to perform full-rate equalizer filter coefficient adaptation. In accordance with another embodiment of the invention, a method of updating a coefficient signal for an adaptive RAM-based equalizer filter configuration is provided. The method selectively variably delays an error signal sample produced by the adaptive RAM-based equalizer filter configuration and an equalizer filter input signal sample and computes with selectively variably error signal sample and the selectively variably delayed equalizer filter input signal sample. Finally, the coefficient signal is updated by adding the product to the coefficient signal.

14 Claims, 2 Drawing Sheets

UPDATE BLOCK FOR AN ADAPTIVE EQUALIZER FILTER CONFIGURATION

RELATED APPLICATIONS

This patent application is related to concurrently filed U.S. patent application Ser. No. 08/581,635, entitled "Update Block For An Adaptive Equalizer Filter Configuration Capable Of Processing Complex-Valued Coefficient Signals," (Raghunath 2) filed Dec. 28, 1995, now U.S. Pat. No. 5,805,481, and concurrently filed U.S. patent application Ser. No. 08/581,634, entitled "Equalizer Filter Configuration For Processing Real-Valued And Complex-Valued Signal Samples," (Mondal 1-3) filed Dec. 28, 1995, both assigned to the assignee of the present invention and herein incorporated by reference.

TECHNICAL FIELD

The present invention is related to equalizers and, more particularly, to adaptive equalizers.

BACKGROUND OF THE INVENTION

As is well-known, an equalizer filter may be implemented in either the direct form or the transpose form. See, for example, Chapter 9 of *Principles of CMOS VLSI Design,* by N. Weste and K. Eshraghian, available from Addison-Wesley Publishing Company, 1994, herein incorporated by reference. The transpose form is frequently employed because it provides a pipelined filter structure. An equalizer filter or equalizer filter configuration in this form typically employs one multiply-accumulate (MAC) unit and one delay register per tap of the equalizer filter. However, an equalizer filter may exploit the feature that the clock frequency of the MAC units employed in the equalizer filter may exceed the input data rate or signal sample rate for the filter. In such a structure or configuration, if the clock frequency of the MAC units is F times faster than the signal sample rate, F being a positive integer, fewer MAC units may be employed because the operation of the MAC units may be time-multiplexed. Therefore, a single MAC unit may be utilized in a manner to implement several taps of the filter, referred to in this context as a "filter block." In addition, a random access memory-based (RAM-based) filter architecture may exploit this time-multiplexing approach and also reduce the number of delay registers needed by using random access memory instead.

In an adaptive Least-Mean-Squared (LMS) equalizer employing a RAM-based filter architecture, referred to in this context as a RAM-based equalizer filter configuration, the equalizer filter coefficients are typically assumed to be available from storage. Thus, the adaptation or updating of the coefficients is typically performed "off-line" by an update block. The problem with such an approach is that it reduces the convergence rate of the equalizer output signal due, at least in part, to the delay introduced by "off-line" equalizer filter coefficient adaptation. It may also require additional memory. Therefore, a need exists for an update block or equalizer filter coefficient adaptation technique in which the convergence rate may be improved.

SUMMARY OF THE INVENTION

Briefly, in accordance with one embodiment of the invention, an update block for an adaptive RAM-based equalizer filter configuration comprises: a multiplier, an adder, and a plurality of delay units. The multiplier, adder and delay units are coupled in a manner so as to have the capability to perform full-rate equalizer filter coefficient adaptation.

Briefly, in accordance with another embodiment of the invention, a method of updating a coefficient signal for an adaptive RAM-based equalizer filter configuration comprises the steps of: selectively variably delaying an error signal sample produced by the adaptive RAM-based equalizer filter configuration and an equalizer filter input signal sample; computing a product of the selectively variably delayed error signal sample and the selectively variably delayed equalizer filter input signal sample; and updating the coefficient signal by adding the product to the coefficient signal.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

DETAILED DESCRIPTION

Least-Mean-Squared (LMS) adaptive equalizer filters are well-known, such as described, for example, in *Adaptive Filter Theory,* by S. Haykin, available from Prentice-Hall, Inc., Englewood Cliffs, N.J., 1992, herein incorporated by reference. As previously indicated, the number of multiply-accumulate (MAC) units for an adaptive equalizer filter may be reduced and may also use a random access memory-based or RAM-based filter architecture. In such an architecture, a plurality of random access memory units may store input signal samples as the signal samples become available and the MAC units may operate at a clock frequency exceeding the input data or signal sample rate. See, for example, Chapter 9 of the aforementioned Weste and Eshraghian text. This particular architecture or configuration is referred to in this context as a "RAM-based equalizer filter configuration."

In a RAM-based equalizer filter configuration, the coefficients of the adaptive equalizer filter take the form of signals, referred to in this context as coefficient or multiplier signals, to be applied to the input signal samples to be processed by the equalizer filter. The coefficient signals are typically available from storage. Therefore, adaptation or updating of the coefficient signals is performed "off-line" by separate MAC units, typically. One problem with this approach is that it reduces the convergence rate of the equalizer output signal due, at least in part, to the delay introduced by processing the coefficient signals off-line. Also, additional memory may be required.

Figure 1:
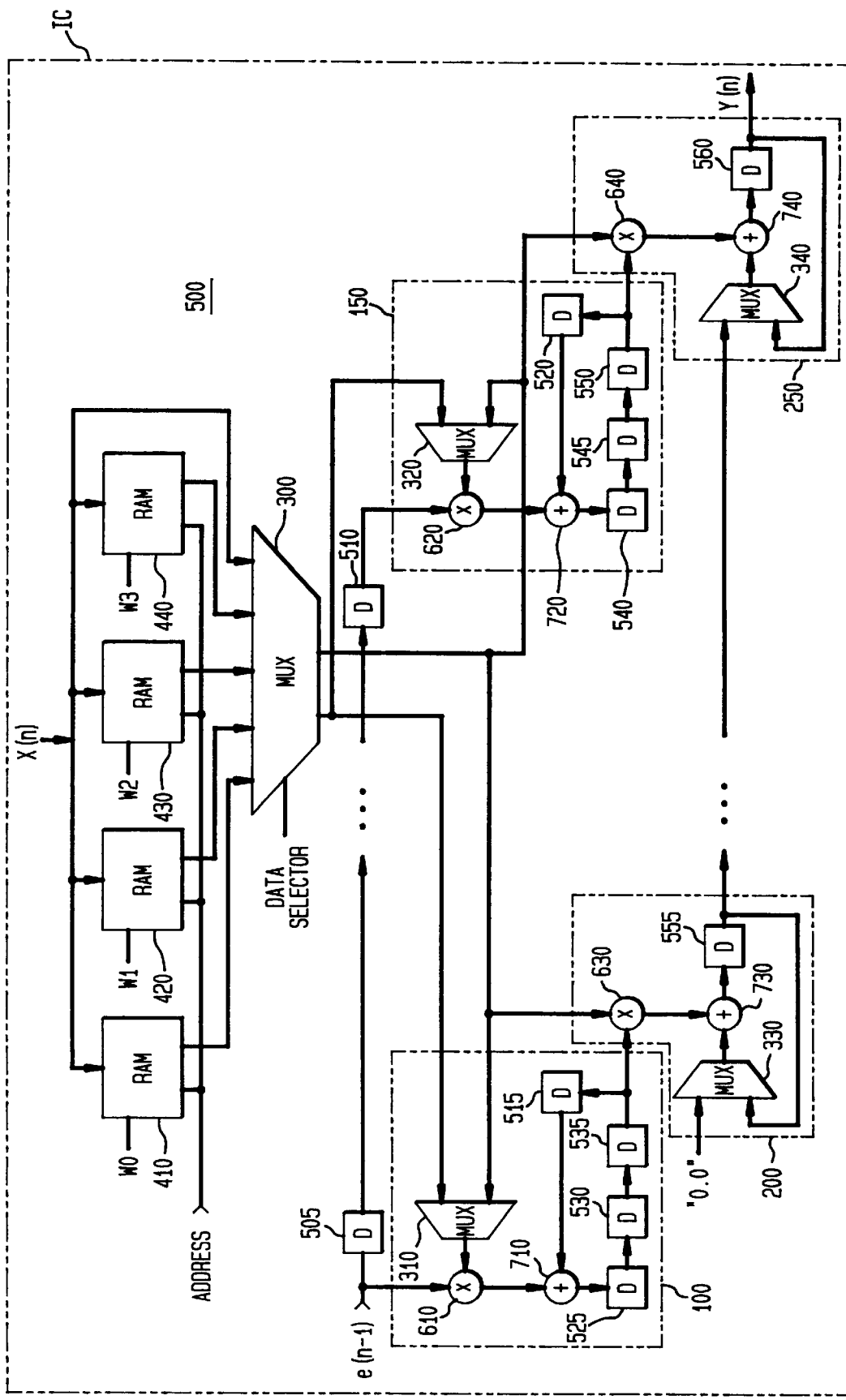
FIG. 1 is a schematic diagram illustrating one embodiment of an adaptive equalizer filter configuration including an embodiment of an update block in accordance with the invention.

FIG. 1 is a schematic diagram illustrating an embodiment 500 of an adaptive RAM-based equalizer filter configuration including an update block in accordance with the invention, although the slicer is omitted. Embodiment 500 is illustrated as embodied on an integrated circuit (IC), although the invention is, of course, not restricted in scope in this respect.

Full-rate equalizer filter coefficient adaptation may be performed by this embodiment. In this context, full-rate equalizer filter coefficient adaptation refers to a process in which the coefficient signals are updated at the signal sample rate. In this particular context, a RAM-based equalizer filter configuration in which full-rate equalizer filter coefficient adaptation may be performed is referred to as an "adaptive RAM-LMS equalizer filter configuration." This particular embodiment, as an example, is implemented as a 64-tap equalizer filter using 16 filter blocks and 16 update blocks, although the invention is, of course, not restricted in scope to this particular embodiment. Each filter block and each update block implements 4 taps using a MAC unit in this particular embodiment, although the invention is, again, not limited in scope in this respect. Furthermore, the adaptive equalizer filter is configured so that the MAC units operate at a clock frequency four times faster than the signal sample rate, as explained in more detail hereinafter. Thus, assuming, for this particular embodiment, a signal sample rate of 10 MHz, the MAC units operate at 40 MHz, although the invention is not limited in scope in this respect. For this particular embodiment, the signal samples and coefficient signals are real-valued, although the invention is not restricted in scope in this respect. For example, aforementioned concurrently filed U.S. patent application Ser. No. 08/581,635 (Raghunath 2) and Ser. No. 08/581,634 (Mondal 1-3), describe equalizer filters employing complex-valued signal samples and coefficient signals. Likewise, the invention is not restricted in scope to the particular MAC unit architecture illustrated in FIG. 1. Other MAC unit architectures may be employed.

As illustrated, in this particular embodiment, four RAM units are employed, although, again, the invention is not limited in scope in this respect. If a RAM unit of sufficient speed were employed, it would be possible to employ a single RAM unit in place of the four RAM units, for example. Nonetheless, in this particular embodiment, RAMs 410, 420, 430 and 440 are employed. Likewise, a double multiplexer (MUX), designated 300, is also employed. Filter blocks 200 and 250, as well as update blocks 100 and 150, are also illustrated. The configuration of these filter blocks and update blocks is described in greater detail hereinafter.

Because in this particular embodiment each MAC unit operates at a clock frequency or rate approximately four times the signal sample rate, four random access memories are employed. In this embodiment, each RAM stores 16 signal samples out of 64 signal samples. The effect of this is to delay signal samples so that the delayed samples may be processed by the MAC units of the adaptive equalizer filter between signal samples, X(n), arriving at the signal sample rate, as explained in more detail hereinafter. For example, after the four RAMs contain, as a group, 64 stored signal samples, the next signal sample available replaces the oldest signal sample stored in the RAMs, which in this particular case is delayed by 64 sample periods. This delayed signal sample is read from RAM, such as RAM 410, and the most recently available signal sample, X(n), is stored in its place, or written to that memory location, such as in RAM 410. Thus, using this particular RAM architecture, via MUX 300, signal samples X(n) and X(n-64) are both available to the adaptive equalizer, and may be employed in processing, as explained in more detail hereinafter. Likewise, as shall be further explained in more detail, because the MAC units operate at a rate four times the signal sample rate, delayed signal sample values may also be read from RAMs 420, 430, and 440 before another signal sample becomes available or the signal sample period has elapsed. Thus, signal samples X(n-16), X(n-32) and X(n-48) may also be provided to the filter blocks of the adaptive equalizer filter, as needed, via MUX 300.

The desirability of having signal values X(n), X(n-16), X(n-32), X(n-48) available to the filter blocks may be explained in relation to filter block 200 illustrated in FIG. 1, as an example. Again, as previously explained, these MAC units, such as the MAC unit of filter block 200, for example, operate at a clock frequency that is four times the signal sample rate. Therefore, the MAC unit may perform four multiplications before the sample period has elapsed. Using MUX 300 and RAMs 410, 420, 430 and 440 in the manner previously described, therefore, filter block 200 may be employed to implement the following expression, for example.

$$C_{15} X(n)+C_{31} X(n-16)+C_{47} X(n-32)+C_{63} X(n-48) \quad (1)$$

Expression (1) above represents 4 taps of the 64-tap equalizer filter; although, the signal samples employed with these particular coefficients are not yet sufficiently delayed to implement the equalizer filter and the remaining 60 taps for this particular example need to be implemented as well. Nonetheless, because the output signal produced by filter block 200, represented by expression (1) above, shall be provided to other filter blocks for subsequent processing, ultimately the signal samples employed should realize the proper amount of delay due to the delay introduced by completing the signal processing through these other filter blocks. Likewise, these other filter blocks should implement the other filter taps of the equalizer filter as needed.

The operation of the filter blocks may be understood by referring to filter block 200. During operation, when an input signal sample, X(n), is available, the signal sample is provided to a multiplier, such as 630, then multiplied by a coefficient or multiplier signal, such as $C_{15}$, provided by an update block, such as 100. The operation of the update blocks illustrated shall be described in more detail later. Multiplier 630 provides the product, such as $C_{15}X(n)$, to an adder, such as 730, where it is summed with the signal value provided by MUX 330. For filter block 200, this particular signal value is zero, as illustrated. This sum is then provided to a delay unit, such as 555. On the next clock cycle, although the signal sample period has not elapsed, RAM 440, for example, may provide signal sample X(n-16), for example, via MUX 300 to multiplier 630 for multiplication by a coefficient or multiplier signal, such as $C_{31}$, the product again being provided to an adder 730. However, on this clock cycle, delay unit 555 provides the signal value obtained on the prior clock cycle, $C_{15}X(n)$, to MUX 330 so that it may be summed by adder 730 with the product just previously computed by multiplier 630, $C_{31}X(n-16)$. This sum is then stored in delay unit 555, again for the next clock cycle. Likewise, this cycle may be repeated in order to implement expression (1) in four clock cycles before the next input signal sample, X(n), is available.

It will now be appreciated that a similar process is performed in the other filter blocks as well. In this embodiment, each filter block receives the same input signal samples via MUX 300; however, each filter block is coupled to a different update block providing different coefficient signals. In this embodiment, because each filter block receives different coefficient signals, but the various filter blocks are coupled together, as explained in more detail hereinafter, the filter blocks in combination implement the desired equalizer filter. If filter block 200 is designated FB15 for the sixteenth filter block and filter block 250 is designated FB0 for the first filter block, for example, the filter blocks implement the following respective expressions:

$$FB15(n+1)=C_{15}X(n)+C_{31}X(n-16)+C_{47}X(n-32)+C_{63}X(n-48) \quad (1aa)$$

$$FB14(n+1)=C_{14}X(n)+C_{30}X(n-16)+C_{46}X(n-32)+C_{62}X(n-48)+FB15(n) \quad (1a)$$

$$FB13(n+1)=C_{13}X(n)+C_{29}X(n-16)+C_{45}X(n-32)+C_{61}X(n-48)+FB14(n) \quad (1b)$$

$$FB12(n+1)=C_{12}X(n)+C_{28}X(n-16)+C_{44}X(n-32)+C_{60}X(n-48)+FB13(n) \quad (1c)$$

$$FB11(n+1)=C_{11}X(n)+C_{27}X(n-16)+C_{43}X(n-32)+C_{59}X(n-48)+FB12(n) \quad (1d)$$

$$FB10(n+1)=C_{10}X(n)+C_{26}X(n-16)+C_{42}X(n-32)+C_{58}X(n-48)+FB11(n) \quad (1e)$$

$$FB9(n+1)=C_9X(n)+C_{25}X(n-16)+C_{41}X(n-32)+C_{57}X(n-48)+FB10(n) \quad (1f)$$

$$FB8(n+1)=C_8X(n)+C_{24}X(n-16)+C_{40}X(n-32)+C_{56}X(n-48)+FB9(n) \quad (1g)$$

$$FB7(n+1)=C_7X(n)+C_{23}X(n-16)+C_{39}X(n-32)+C_{55}X(n-48)+FB8(n) \quad (1h)$$

$$FB6(n+1)=C_6X(n)+C_{22}X(n-16)+C_{38}X(n-32)+C_{54}X(n-48)+FB7(n) \quad (1i)$$

$$FB5(n+1)=C_5X(n)+C_{21}X(n-16)+C_{37}X(n-32)+C_{53}X(n-48)+FB6(n) \quad (1j)$$

$$FB4(n+1)=C_4X(n)+C_{20}X(n-16)+C_{36}X(n-32)+C_{52}X(n-48)+FB5(n) \quad (1k)$$

$$FB3(n+1)=C_3X(n)+C_{19}X(n-16)+C_{35}X(n-32)+C_{51}X(n-48)+FB4(n) \quad (1l)$$

$$FB2(n+1)=C_2X(n)+C_{18}X(n-16)+C_{34}X(n-32)+C_{50}X(n-48)+FB3(n) \quad (1m)$$

$$FB1(n+1)=C_1X(n)+C_{17}X(n-16)+C_{33}X(n-32)+C_{49}X(n-48)+FB2(n) \quad (1n)$$

$$FB0(n+1)=C_0X(n)+C_{16}X(n-16)+C_{32}X(n-32)+C_{48}X(n-48)+FB1(n) \quad (1o)$$

Expression (1o), for example, is implemented by filter block 250 of FIG. 1. Likewise, it will now be appreciated by one skilled in the art that the form of these expressions is generalizable so that different-sized equalizer filters, different numbers of MAC units and RAMs, and different signal sample rates and clock frequencies, for example, may be accommodated.

Referring again to filter block 200, the output signal of this filter block, now stored in delay unit 555, may be provided to the next successive filter block (not shown). By providing the output signal of filter block 200 to the next successive filter block and thereby allow processing of the next available signal sample by filter block 200, the output signal of filter block 200 provided is effectively delayed by one sample period. For example, this output signal may be provided to a MUX in the next successive filter block, which may be substantially equivalent to MUX 330, for example, so that this signal may now be summed with the signal developed by the MAC unit of that next successive filter block. Likewise, this process may be continued at each of the filter blocks, such as illustrated in FIG. 1. Therefore, as illustrated by the previous expressions, on each sample period, the output signal of a particular filter block may be provided to the next successive filter block. Thus, an output signal originating from filter block 200 is delayed by 15 sample periods by the time that signal is produced at the output port of the equalizer filter. Likewise, an equalizer filter configuration output signal value, Y(n), is, therefore, provided in accordance with the following equation as each equalizer filter configuration input signal sample, X(n), is continually available to be processed by the adaptive equalizer configuration.

$$Y(n)=C_0X(n)+C_1X(n-1)+C_2X(n-2)+C_3X(n-3)+\ldots+C_{60}X(n-60)+C_{61}X(n-61)+C_{62}X(n-62)+C_{63}X(n-63) \quad (1p)$$

Figures 2, 3:
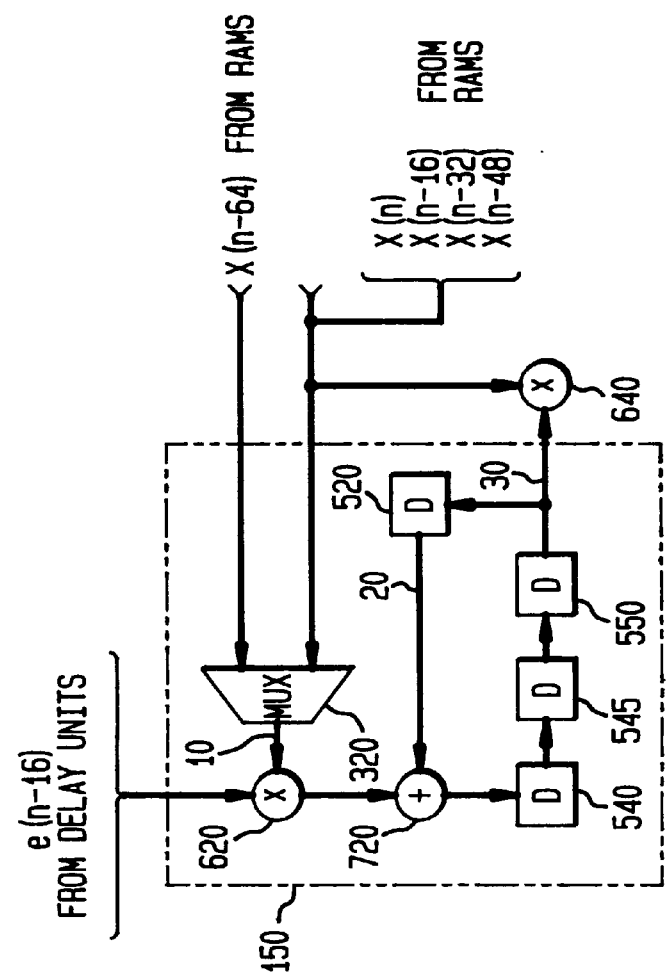
FIG. 2 is a schematic diagram illustrating a portion of FIG. 1 in greater detail.
FIG. 3 is a table illustrating timing for the processing of various signals and signal samples for the portion of FIG. 1 illustrated in FIG. 2.

FIG. 2 is a schematic diagram of update block 150 shown in greater detail. As previously indicated, although typically updating the coefficient or multiplier signals for an adaptive equalizer is performed "off-line," these approaches typically result in slower convergence. Therefore, update block 150 is a schematic diagram of an embodiment of an update block of an adaptive RAM-based equalizer filter configuration in accordance with the invention that provides full-rate equalizer filter coefficient adaptation so that the rate of convergence may be improved in comparison with prior art approaches. As previously explained, a RAM-based equalizer filter configuration employing such an update block, such as update block 150 illustrated in FIG. 2, for example, is referred to as an adaptive RAM-LMS equalizer filter configuration.

As is well-known, the coefficients of an adaptive equalizer may be updated in accordance with the following equation:

$$C_i(n+1)=C_i(n)+e(n)\cdot X(n-i) \quad (2)$$

where n is a positive integer indexing the discrete signal sample periods, $C_i(n)$ is a current equalizer filter coefficient signal to be updated, and e(n) is an output error signal for the equalizer filter produced by comparing the output signal of the equalizer filter with the output signal of a slicer (not shown). It is noted that where the signal sample period index is omitted in connection with a coefficient, the index is understood based upon the particular context.

Although update block 150, as an example, does not implement equation (2) above, nonetheless, update block 150, and the other update blocks, may be employed to implement an approximation to the above equation that is suitable for most applications of an adaptive equalizer filter. For example, update block 150 may be employed to update coefficients $C_0$, $C_{16}$, $C_{32}$ and $C_{48}$ in accordance with the following equations.

$$C_0(n+1)=C_0(n)+e(n-16)X(n-16)$$

$$C_{16}(n+1)=C_{16}(n)+e(n-16)X(n-32)$$

$$C_{32}(n+1)=C_{32}(n)+e(n-16)X(n-48)$$

$$C_{48}(n+1)=C_{48}(n)+e(n-16)X(n-64) \quad (3)$$

One reason why this approximation to equation (2) above may be employed is because, the signal samples useful for adaptation are either available or may be obtained from the RAMs. Furthermore, the error signal samples are not immediately available to the update block in order to implement equation (2) in real-time. Therefore, the error signal sample may be selectively variably delayed to correspond with the available signal samples that may be selectively variably delayed by storage in the RAMs. Not only is the operation of the filter left undisturbed, in addition, because each update block employs essentially the same signal samples, the signal samples useful for adaptation may be provided without the use of multiple signal buses, such as illustrated in FIG. 2 by the use of MUX 300. Likewise, it may be demonstrated that employing a selectively variably delayed approach, as illustrated by equations (3) above, for example, will nonetheless result in convergence after a sufficient number of samples. In this context, the error signal samples and input signal samples are referred to as "selectively variably delayed" because, as illustrated in FIG. 1, different amounts of delay of the error signal samples and input signal samples are provided to different update blocks, such as update blocks 100 and 150. Update block 150 implements equations (3) above, as described in more detail hereinafter.

It will now be appreciated that a similar process is performed in the other update blocks as well. In this embodiment, each update block receives the same selectively variably delayed input signal samples via MUX 300. Likewise, each update block receives an error signal sample that has been selectively variably delayed and each update block processes different coefficient signals in accordance with the following equations:

$$C_1(n+1)=C_1(n)+e(n-15)X(n-16)$$

$$C_{17}(n+1)=C_{17}(n)+e(n-15)X(n-32)$$

$$C_{33}(n+1)=C_{33}(n)+e(n-15)X(n-48)$$

$$C_{49}(n+1)=C_{49}(n)+e(n-15)X(n-64) \quad (3a)$$

$$C_2(n+1)=C_2(n)+e(n-14)X(n-16)$$

$$C_{18}(n+1)=C_{18}(n)+e(n-14)X(n-32)$$

$$C_{34}(n+1)=C_{34}(n)+e(n-14)X(n-48)$$

$$C_{50}(n+1)=C_{50}(n)+e(n-14)X(n-64) \quad (3b)$$

$$C_{15}(n+1)=C_{15}(n)+e(n-1)X(n-16)$$

$$C_{21}(n+1)=C_{21}(n)+e(n-1)X(n-32)$$

$$C_{47}(n+1)=C_{47}(n)+e(n-1)X(n-48)$$

$$C_{63}(n+1)=C_{63}(n)+e(n-1)X(n-64) \quad (3c)$$

It may be noted that these equations may be further pipelined during implementation for speed related considerations, such as to accommodate delays due to processing through the MUXes or the slicer (not shown), for example. Likewise, as discussed with respect to the filter blocks, although these equations are provided as a specific example, it will be appreciated that this approach to the update blocks is generalizable to accommodate other embodiments of an adaptive RAM-LMS equalizer filter configuration in accordance with the invention.

Referring to FIG. 2, as previously described, in this embodiment delayed signal samples X(n-16), X(n-32), X(n-48), and X(n-64) are provided from RAMs 440, 430, 420 and 410, respectively. Likewise, input signal sample, X(n), is also provided. These signal samples samples are provided via MUX 300 to MUX 320 of update block 150, for example. As illustrated, signals X(n), X(n-16), X(n-32), X(n-48) are provided to multiplier 640. However, delayed signal sample X(n-64) is provided to MUX 320, but not to multiplier 640. The reason for this difference, as will become clear, is that X(n) is employed by filter block 250, for example, to perform equalizer processing, such as described in connection with filter block 200, although X(n-64) is employed by update block 150 to perform adaptation or updating of the adaptive equalizer filter coefficients. As illustrated, MUX 320 provides a selectively variably-delayed input signal sample via path 10 to multiplier 620. Likewise, the selectively variably delayed error signal, e(n-16) for update block 150, is also provided to multiplier 620 from delay unit 510 of FIG. 1. Multiplier 620 provides the product of an input signal sample and an error signal sample as an output signal to adder 720. Multiplier 620 may, likewise, be implement in a straight-forward manner by simply changing the sign of the input signal sample in embodiments in which the error signal sample is either positive one or negative one to simplify the signal processing, referred to in this context as "sign LMS." Embodiments of an update block in accordance with the invention, of course, include such hardware efficient approaches to multiplier implementation.

As illustrated by equations (3) above, the last term of equations (3) is implemented by multiplier 620 in which error signal e(n-16) is multiplied by various selectively variably delayed input signal samples, such as X(n-16), X(n-32), X(n-48), and X(n-64). Equations (3) above also illustrate that the updated coefficient signal is obtained by summing the product output signal of multiplier 620 with the previously obtained adaptive equalizer coefficient signal. This previous coefficient signal is provided by delay unit 520 via path 20 to adder 720. As illustrated in FIG. 2, a delay loop is implemented in which the output signal of adder 720 is provided to a closed loop delay path including delay units 540, 545, 550 and adder 720. Therefore, multiplier 620, adder 720, and a plurality of delay units are coupled in a manner so as to perform full-rate equalizer filter coefficient adaptation, although, of course, more or fewer delay units may be employed, depending upon the particular embodiment. The updated coefficient signal is then employed by multiplier 640 with the signal sample provided via MUX 300 to perform equalizer processing and then this previously updated coefficient signal is provided to delay unit 520 so that it may continue to be subject to full-rate adaptation or updating via path 20 to adder 720.

As the previous discussion illustrates, the sequencing of the selectively variably delayed input signal samples and the coefficient signals in update block 150, for example, should be arranged in a fashion to ensure that equations (3) above, for example, are implemented properly. FIG. 3 is a table illustrating, for this particular embodiment, the signal values or signal sample values provided along respective signal paths 5, 10, 20 and 30 of FIG. 2 for four successive cycles of the MAC unit included in update block 150 illustrated in FIG. 2. As the table indicates, coefficient signals $C_0$, $C_{16}$, $C_{32}$ and $C_{48}$ traverse the delay loop signal path successively so that each may be employed with multiplier 640 and then updated via adder 720. Likewise, as previously explained, although signal samples X(n), X(n-16), X(n-32), and X(n-48) are provided to multiplier 640, signal sample X(n-64) is provided to multiplier 620 when X(n) is provided to multiplier 640.

An update block for an adaptive equalizer filter configuration in accordance with the invention, such as embodiment 500 illustrated in FIG. 1, for example, may be operated in accordance with the following method. An error signal sample produced by the adaptive equalizer filter configuration may be delayed. As previously indicated, the error signal sample may be obtained by comparing the output signal of the equalizer filter configuration with the output signal of a slicer (not shown). As illustrated in FIG. 1, the error signal sample may be delayed by a delay unit, such as delay unit 505 illustrated in FIG. 1. Furthermore, the error signal sample may be selectively variably delayed, such as by a succession of delay units forming a signal bus, such as illustrated in FIG. 1. Likewise, a product of the selectively variably delayed error signal sample and a delayed equalizer filter input signal sample may be computed. Furthermore, as illustrated in FIG. 1 the equalizer filter input signal sample may, likewise, be selectively variably delayed. For example, the adaptive equalizer input signal sample may be stored in RAM such as illustrated in FIG. 1 for a substantially predetermined number of sample periods and then provided via a MUX, such as MUX 300, to a signal bus, as illustrated in FIG. 1. After the product is computed, the coefficient signal may be updated by adding the product to the coefficient signal. For the embodiment illustrated in FIG. 1, the coefficient signal may be updated at least once during a signal sample period. Likewise, the steps of selectively variably delaying an error signal sample and an input signal sample and computing a product may be performed at a frequency exceeding the signal sample rate so that the step of updating the coefficient signal by adding the product may comprise updating a plurality of coefficient signals in a signal sample period, as previously explained.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

The invention claimed is:

1. An update block for an adaptive RAM-based equalizer filter configuration comprising:
   a multiplier;
   an adder coupled to the multiplier;
   a first delay unit coupled to the adder, the first delay unit providing an output signal; and
   a second delay unit coupled to the first delay unit and to the adder where the output signal of the first delay unit is provided to the second delay unit and as an output of the update block;
   wherein the update block performs full-rate equalizer filter coefficient adaptation.

2. The update block of claim 1,
   wherein said adaptive RAM-based equalizer filter configuration is coupled in a manner so as to process only real-valued input signal samples.

3. The update block of claim 1,
   wherein said filter block and said update block are coupled so as to operate at a substantially predetermined clock frequency;
   said adaptive RAM-based equalizer filter configuration being coupled so as to operate at a substantially predetermined signal sample rate;
   said substantially predetermined clock frequency exceeding said substantially predetermined signal sample rate.

4. The update block of claim 1,
   wherein said multiplier is coupled in said adaptive RAM-based equalizer filter configuration so as to receive a selectively variably delayed error signal sample and a selectively variably delayed adaptive equalizer input signal sample.

5. An integrated circuit comprising:
   an update block for an adaptive RAM-based equalizer filter configuration including:
   a multiplier;
   an adder;
   a first delay unit coupled to the adder, the first delay unit providing an output signal; and
   a second delay unit coupled to the first delay unit and the adder, the output signal of the first delay unit is provided to the second delay unit and as an output of the update block;
   said multiplier being coupled so as to provide a multiplier output signal to said adder;
   said multiplier being coupled in an adaptive RAM-based equalizer filter configuration so as to receive a selectively variably delayed error signal sample and a selectively variably delayed adaptive equalizer input signal sample.

6. The integrated circuit of claim 5,
   wherein said adaptive RAM-based equalizer filter configuration is coupled in a manner so as to process only real-valued input signal samples.

7. The integrated circuit of claim 5,
   wherein said delay loop is coupled to a filter block in a manner so as to provide an updated coefficient signal to said filter block.

8. The integrated circuit of claim 5,
   wherein said filter block and said update block are coupled so as to operate at a substantially predetermined clock frequency;
   said adaptive RAM-based equalizer filter configuration being coupled so as to operate at a substantially predetermined signal sample rate;
   said substantially predetermined clock frequency exceeding said substantially predetermined signal sample rate.

9. A method of updating a coefficient signal for an adaptive RAM-based equalizer filter configuration comprising the steps of:
   selectivity variably delaying an error signal sample produced by the adaptive RAM-based equalizer filter configuration and an equalizer filter input signal sample;
   computing a product signal of the selectivity variably delayed error signal sample and the selectively variably delayed equalizer filter input signal sample;
   delaying the product signal to produce a delayed product signal;
   providing the delayed product signal to a filter;
   delaying the delayed product signal to produce a further delayed product signal; and
   updating the coefficient signal by adding the further delayed product signal to the coefficient signal.

10. The method of claim 9,
    wherein the step of selectively variably delaying an adaptive equalizer input signal sample comprises storing the adaptive equalizer input signal sample in RAM for a substantially predetermined number of signal sample periods.

11. The method of claim 9,
    wherein the step of selectively variably delaying an error signal sample comprises propagating the error signal sample along a plurality of successively-coupled delay units.

12. The method of claim 9,
    wherein the step of updating the coefficient signal comprises updating the coefficient signal at least once during a signal sample period.

13. The method of claim 9,
    wherein the step of computing a product is performed by a multiplier; and
    the step of updating the coefficient signal by adding the product to the coefficient signal is performed by an adder.

14. The method of claim 9,
    wherein the steps of selectively variably delaying an error signal sample and an equalizer filter input signal sample and computing a product of the selectively variably delayed error signal sample and the selectively variably delayed input signal sample are performed at a frequency rate exceeding the signal sample rate; and the step of updating the coefficient by adding the product to the coefficient signal comprising updating a plurality of coefficient signals in a signal sample period.

* * * * *